United States Patent
Darwish et al.

(10) Patent No.: US 6,921,697 B2
(45) Date of Patent: Jul. 26, 2005

(54) METHOD FOR MAKING TRENCH MIS DEVICE WITH REDUCED GATE-TO-DRAIN CAPACITANCE

(75) Inventors: Mohamed N. Darwish, Campbell, CA (US); Frederick P. Giles, San Jose, CA (US); Kam Hong Lui, Santa Clara, CA (US); Kuo-In Chen, Los Altos, CA (US); Kyle Terrill, Santa Clara, CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 10/264,816

(22) Filed: Oct. 3, 2002

(65) Prior Publication Data

US 2003/0062570 A1 Apr. 3, 2003

Related U.S. Application Data

(62) Division of application No. 09/927,320, filed on Aug. 10, 2001.

(51) Int. Cl.[7] .............................................. H01L 21/336
(52) U.S. Cl. .................. 438/270; 438/268; 438/272; 438/273; 257/329; 257/330; 257/332; 257/335
(58) Field of Search ........................... 438/242, 243, 438/244, 268, 270, 272–73; 257/301, 302, 303, 304, 329–30, 332, 335

(56) References Cited

U.S. PATENT DOCUMENTS

| 4,893,160 | A | * | 1/1990 | Blanchard | 257/334 |
|---|---|---|---|---|---|
| 4,894,695 | A | * | 1/1990 | Ishii et al. | 257/301 |
| 4,953,125 | A | | 8/1990 | Okumura et al. | 365/149 |
| 4,992,390 | A | * | 2/1991 | Chang | 438/270 |
| 5,183,772 | A | | 2/1993 | Jin et al. | 437/52 |
| 5,424,231 | A | | 6/1995 | Yang | 437/40 |
| 5,432,365 | A | | 7/1995 | Chin et al. | 257/301 |
| 6,071,794 | A | * | 6/2000 | Lin et al. | 438/424 |
| 6,262,453 | B1 | | 7/2001 | Hshieh | 257/341 |
| 6,265,269 | B1 | * | 7/2001 | Chen et al. | 438/270 |
| 6,291,298 | B1 | | 9/2001 | Williams et al. | 438/270 |
| 6,391,699 | B1 | * | 5/2002 | Madson et al. | 438/212 |
| 6,437,386 | B1 | | 8/2002 | Hurst et al. | |
| 6,444,528 | B1 | * | 9/2002 | Murphy | 438/270 |

FOREIGN PATENT DOCUMENTS

| DE | 199 35 442 | 12/2000 | ......... H01L/21/336 |
|---|---|---|---|
| WO | WO 98/04004 | 1/1998 | |
| WO | 00/72372 | 11/2000 | ......... H01L/21/336 |

* cited by examiner

Primary Examiner—George Eckert
Assistant Examiner—Edgardo Ortiz

(57) ABSTRACT

Trench MIS devices including a thick insulative layer at the bottom of the trench are disclosed, along with methods of fabricating such devices. An exemplary trench MOSFET embodiment includes a thick oxide layer at the bottom of the trench, with no appreciable change in stress in the substrate along the trench bottom. The thick insulative layer separates the trench gate from the drain region at the bottom of the trench yielding a reduced gate-to-drain capacitance making such MOSFETs suitable for high frequency applications. In an exemplary fabrication process embodiment, the thick insulative layer is deposited on the bottom of the trench. A thin insulative gate dielectric is formed on the exposed sidewall and is coupled to the thick insulative layer. A gate is formed in the remaining trench volume. The process is completed with body and source implants, passivation, and metallization.

7 Claims, 15 Drawing Sheets

METHOD FOR MAKING TRENCH MIS DEVICE WITH REDUCED GATE-TO-DRAIN CAPACITANCE

CROSS-REFERENCE TO RELATED APPLICATIONS

This application is a divisional of application Ser. No.: 09/927,320, filed Aug. 10, 2001, incorporated herein by reference in its entirety.

FIELD OF THE INVENTION

This invention relates to trench metal-insulator-semiconductor (MIS) devices and in particular to trench MOSFETs that are suitable for high frequency operation.

BACKGROUND

Some metal-insulator-semiconductor (MIS) devices include a gate located in a trench that extends downward from the surface of a semiconductor substrate (e.g., silicon). The current flow in such devices is primarily vertical and, as a result, the cells can be more densely packed. All else being equal, this increases the current carrying capability and reduces the on-resistance of the device. Devices included in the general category of MIS devices include metal-oxide-semiconductor field effect transistors (MOSFETs), insulated gate bipolar transistors (IGBTs), and MOS-gated thyristors.

Trench MOSFETs, for example, can be fabricated with a high transconductance ($g_{m,max}$) and low specific on resistance ($R_{on}$), which are important for optimal linear signal amplification and switching. One of the most important issues for high frequency operation, however, is reduction of the MOSFET internal capacitances. The internal capacitances include the gate-to-drain capacitance ($C_{gd}$), which is also called the feedback capacitance ($C_{rss}$), the input capacitance ($C_{iss}$), and the output capacitance ($C_{oss}$).

FIG. 1 is a cross-sectional view of a conventional n-type trench MOSFET 10. In MOSFET 10, an n-type epitaxial ("N-epi") layer 13, which is usually grown on an N+ substrate (not shown), is the drain. N-epi layer 13 may be a lightly doped layer, that is, an N− layer. A p-type body region 12 separates N-epi layer 13 from N+ source regions 11. Current flows vertically through a channel (denoted by the dashed lines) along the sidewall of a trench 19. The sidewall and bottom of trench 19 are lined with a thin gate insulator 15 (e.g., silicon dioxide). Trench 19 is filled with a conductive material, such as doped polysilicon, which forms a gate 14. Trench 19, including gate 14 therein, is covered with an insulative layer 16, which may be borophosphosilicate glass (BPSG). Electrical contact to source regions 11 and body region 12 is made with a conductor 17, which is typically a metal or metal alloy. Gate 14 is contacted in the third dimension, outside of the plane of FIG. 1.

A significant disadvantage of MOSFET 10 is a large overlap region 18 formed between gate 14 and N-epi layer 13, which subjects a portion of thin gate insulator 15 to the drain operating voltage. The large overlap limits the drain voltage rating of MOSFET 10, presents long term reliability issues for thin gate insulator 15, and greatly increases the gate-to-drain capacitance, $C_{gd}$, of MOSFET 10. In a trench structure, $C_{gd}$ is larger than in conventional lateral devices, limiting the switching speed of MOSFET 10 and thus its use in high frequency applications.

One possible method to address this disadvantage is described in the above-referenced application Ser. No. 09/591,179 and is illustrated in FIG. 2. FIG. 2 is a cross-sectional view of a trench MOSFET 20 with an undoped polysilicon plug 22 near the bottom of trench 19. MOSFET 20 is similar to MOSFET 10 of FIG. 1, except for polysilicon plug 22, which is isolated from the bottom of trench 19 by oxide layer 21 and from gate 14 by oxide layer 23. The sandwich of oxide layer 21, polysilicon plug 22, and oxide layer 23 serves to increase the distance between gate 14 and N-epi layer 13, thereby decreasing $C_{gd}$.

In some situations, however, it may be preferable to have a material even more insulative than undoped polysilicon in the bottom of trench 19 to minimize $C_{gd}$ for high frequency applications. Accordingly, a trench MOSFET with decreased gate-to-drain capacitance, $C_{gd}$, and better high frequency performance is desirable.

SUMMARY

In accordance with the present invention, a metal-insulator-semiconductor (MIS) device includes a semiconductor substrate including a trench extending into the substrate from a surface of the substrate. A source region of a first conductivity type is adjacent to a sidewall of the trench and to the surface of the substrate. A body region of a second conductivity type opposite to the first conductivity type is adjacent to the source region and to the sidewall. A drain region of the first conductivity type is adjacent to the body region and to the sidewall. The trench is lined with a first insulative layer along a portion of the sidewall that abuts the body region. The trench is also lined with a second insulative layer along a bottom portion of the trench. The second insulative layer is coupled to the first insulative layer, and the second insulative layer is thicker than the first insulative layer. The stress in the substrate along the bottom portion of the trench does not change appreciably.

In an exemplary embodiment of a fabrication process for such an MIS device, a trench including a sidewall and a bottom is formed in a substrate. A thick insulative layer is deposited on the bottom of the trench. A thin insulative layer is formed on the sidewall, and is coupled to the thick insulative layer. A gate is formed above the portion of the thick insulative layer and adjacent to the thin insulative layer in the trench.

The thick insulative layer separates the trench gate from the drain conductive region at the bottom of the trench resulting in a reduced gate-to-drain capacitance. This makes MIS devices in accordance with the present invention, such as trench MOSFETs, suitable for high frequency applications.

BRIEF DESCRIPTION OF THE DRAWINGS

This invention will be better understood by reference to the following description and drawings. In the drawings, like or similar features are typically labeled with the same reference numbers.

DETAILED DESCRIPTION OF THE INVENTION

Figure 1:
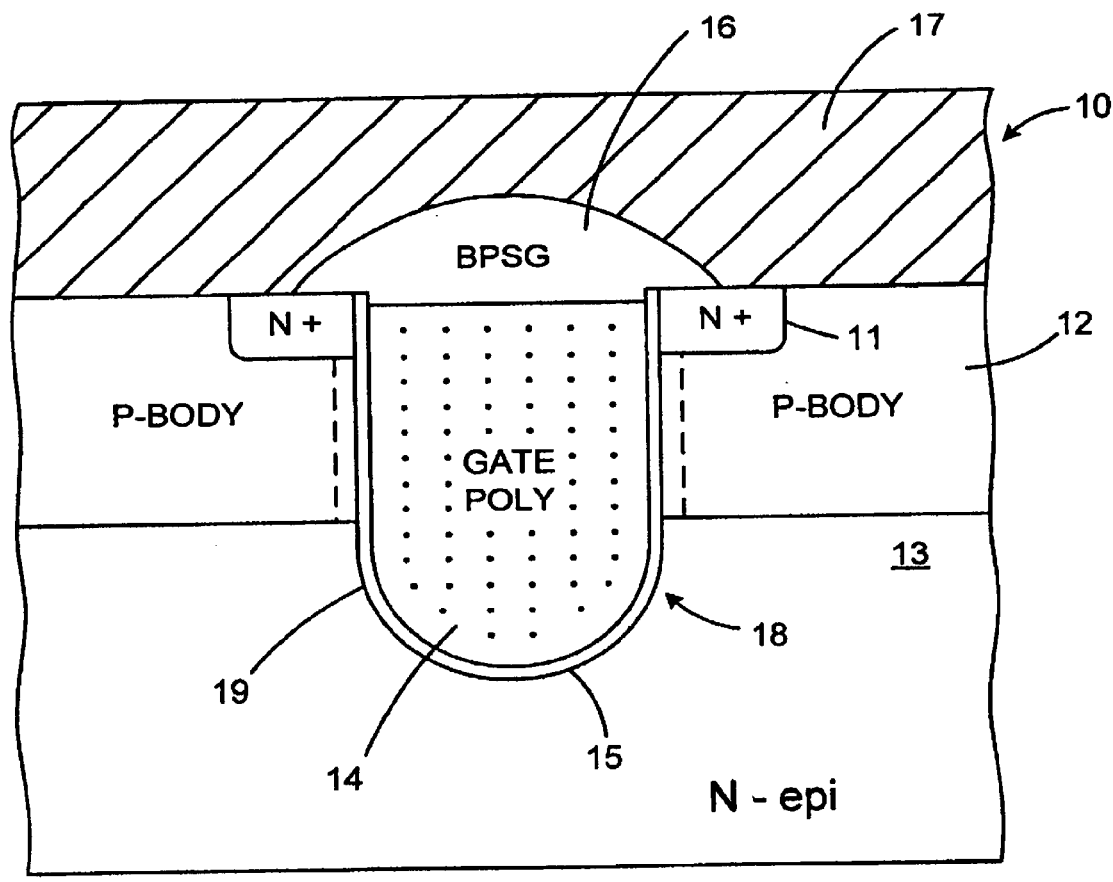
FIG. 1 is a cross-sectional view of a conventional trench MOSFET.
Figure 2:
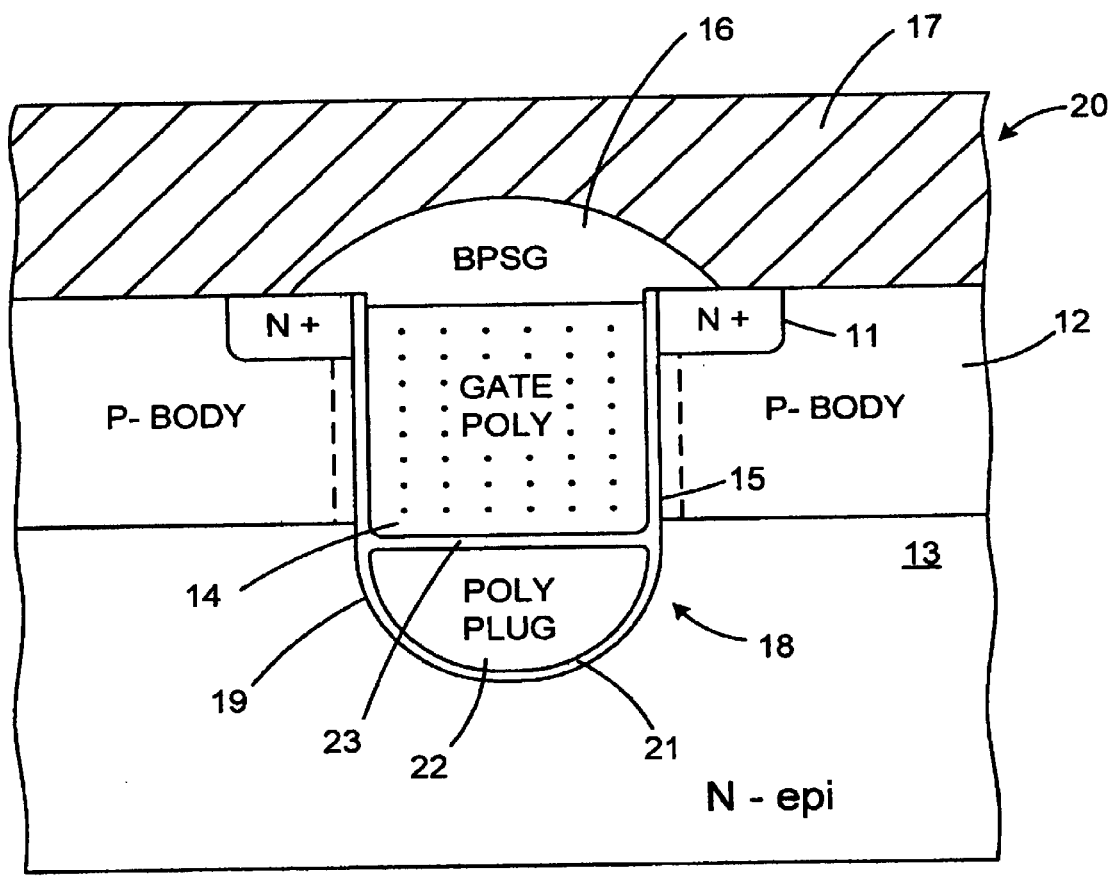
FIG. 2 is a cross-sectional view of a trench MOSFET with a polysilicon plug at the bottom of the trench.
Figure 3:
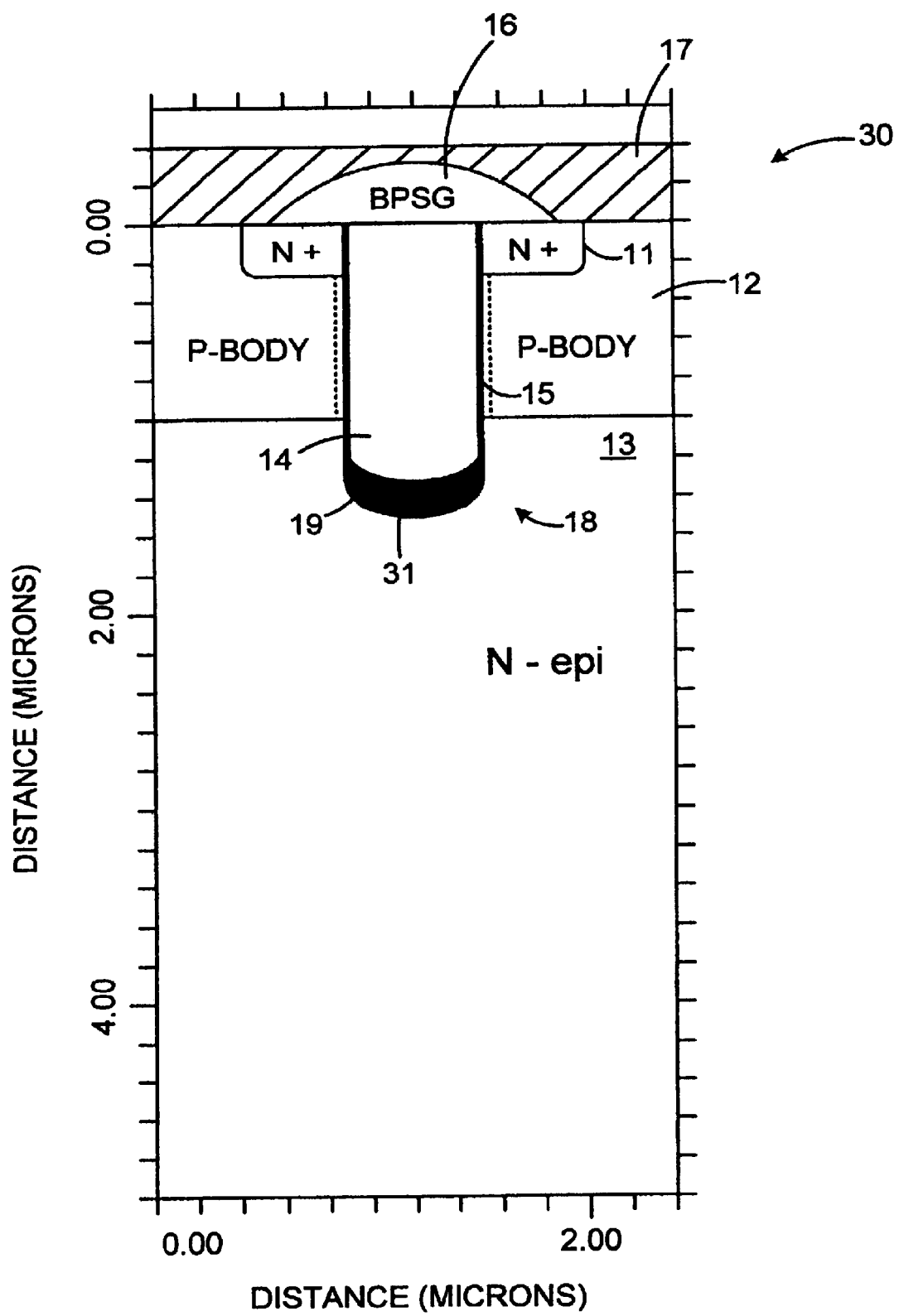
FIG. 3 is a cross-sectional view of one embodiment of a trench MOSFET in accordance with the present invention.

FIG. 3 is a cross-sectional view of one embodiment of a trench MOSFET 30 in accordance with the present invention. MOSFET 30 has some similarities to MOSFET 10 of FIG. 1. The elements of MOSFET 30 outside of trench 19 can be the same as those of MOSFET 10 of FIG. 1. In MOSFET 30, however, only the sidewall of trench 19 is lined with thin gate insulator 15 (e.g., silicon dioxide). Unlike MOSFET 10 of FIG. 1, a thick insulative layer 31 (e.g., silicon dioxide) lines the bottom of trench 19 of MOSFET 30 of FIG. 3. Thick insulative layer 31 separates gate 14 from N-epi layer 13 (which may be an N⁻ layer). This circumvents the problems that occur when only thin gate insulator 15 separates gate 14 from N-epi layer 13 (the drain) as in FIG. 1. Thick insulative layer 31 also provides a more effective insulator than is achievable with polysilicon plug 22 as shown in FIG. 2. Thus, thick insulative layer 31 minimizes the gate-to-drain capacitance, $C_{gd}$, and yields a trench MOSFET 30 useful for high frequency applications.

Figure 4A:
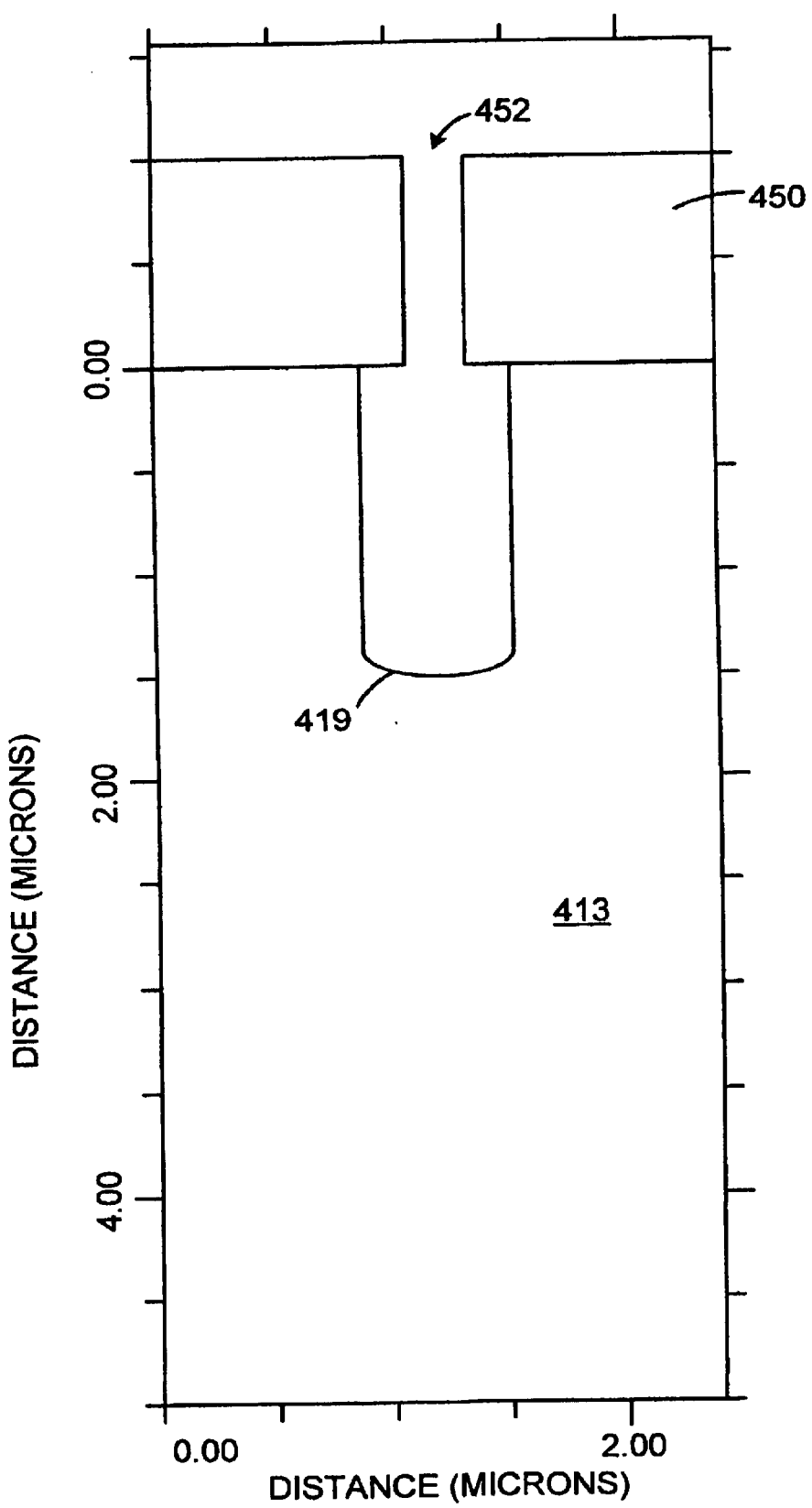
FIGS. 4A–4K are cross-sectional views illustrating one embodiment of a process for fabricating a trench MOSFET in accordance with the present invention.

FIGS. 4A–4K are cross-sectional views illustrating one embodiment of a process for fabricating a trench MOSFET, such as MOSFET 30 of FIG. 3, in accordance with the present invention. As shown in FIG. 4A, the process begins with a lightly-doped N-epi layer 413 (typically about 8 μm thick) grown on a heavily doped N⁺ substrate (not shown). A trench mask 450, which may be photoresist or an oxide, is deposited on N-epi layer 413 and patterned to form an opening 452 where a trench 419 is to be located. Trench 419 is etched through opening 452, typically using a dry plasma etch, for example, a reactive ion etch (RIE). Trench 419 may be about 0.5–1.2 μm wide and about 1–2 μm deep.

Figure 4B:
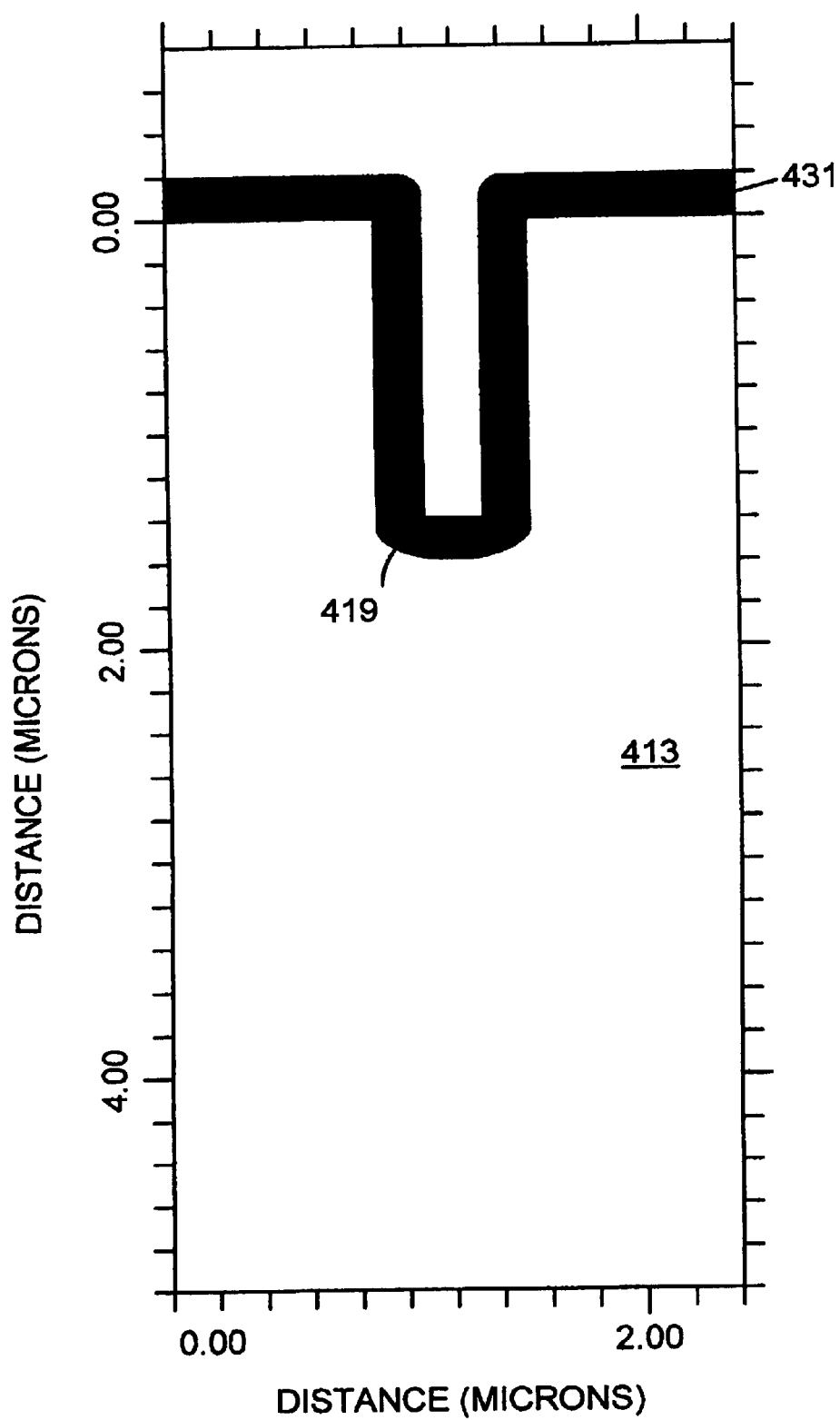

Mask 450 is removed, and a thick insulative layer 431 (e.g., about 0.1–0.3 μm) is deposited on N-epi layer 413, as shown in FIG. 4B. The deposition process is chosen, according to conventional deposition techniques such as chemical vapor deposition (CVD), to yield conformal deposition of insulative layer 431 on the sidewall and bottom of trench 419, as well as on the top surface of N-epi layer 413. Thick insulative layer 431 may be, for example, a low temperature oxide (LTO), a phosphosilicate glass (PSG), a BPSG, or another insulative material. In some embodiments, a thin insulative layer (e.g., 100–200 Å of silicon dioxide) could be thermally grown, for example, using a well known dry oxidation process at 950 °C. for 10 minutes, prior to deposition of thick insulative layer 431.

Figure 4C:
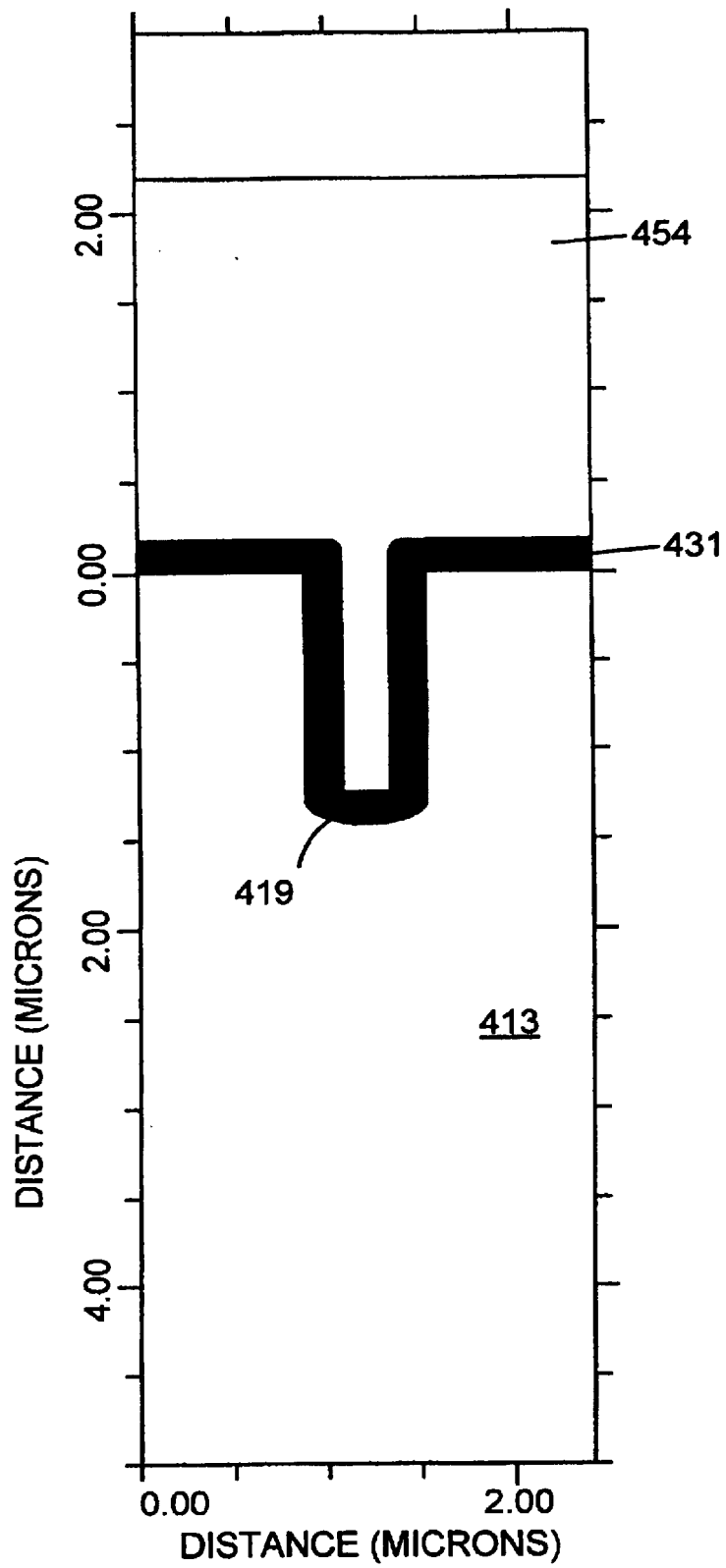
Figure 4D:
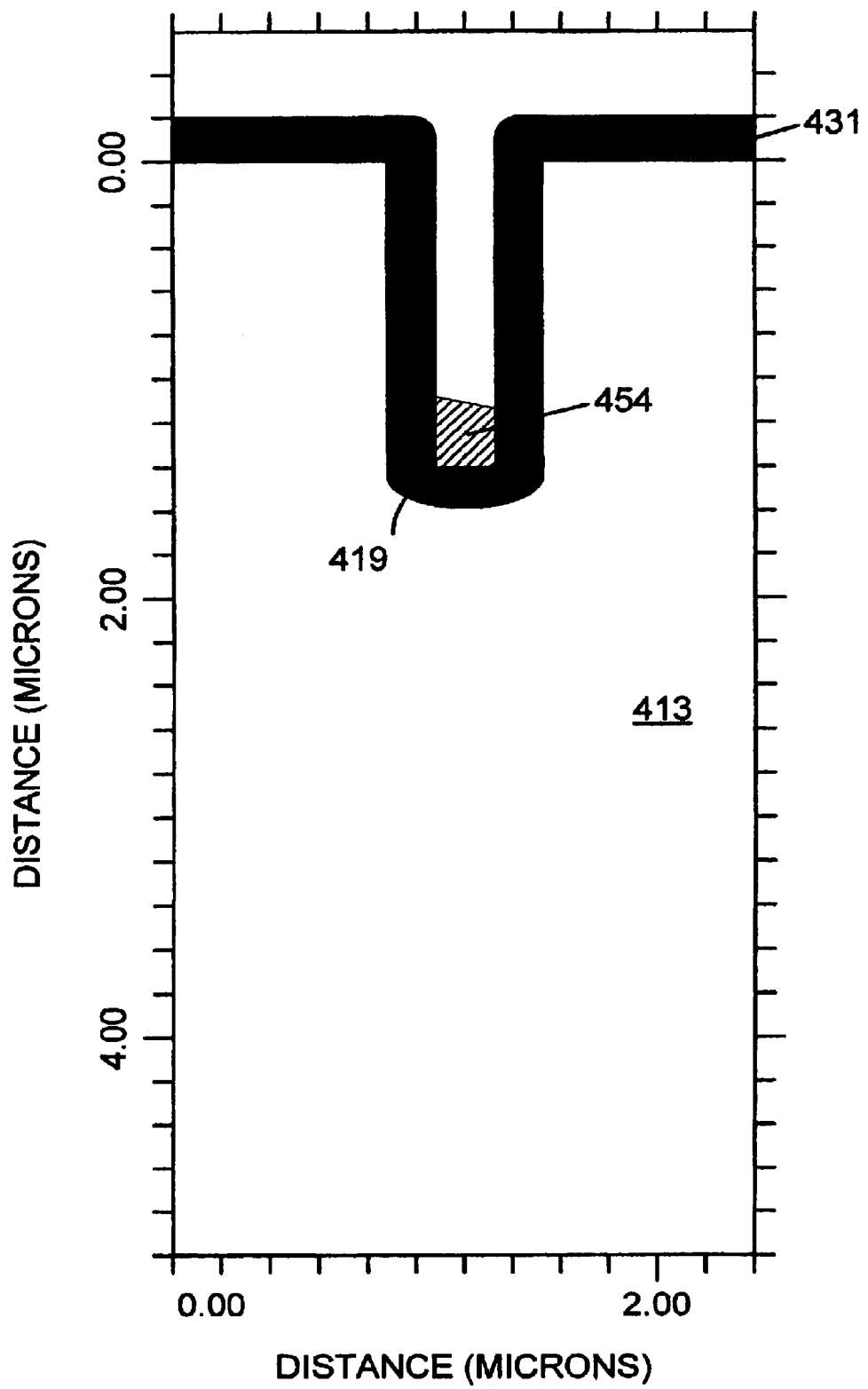
Figure 4E:
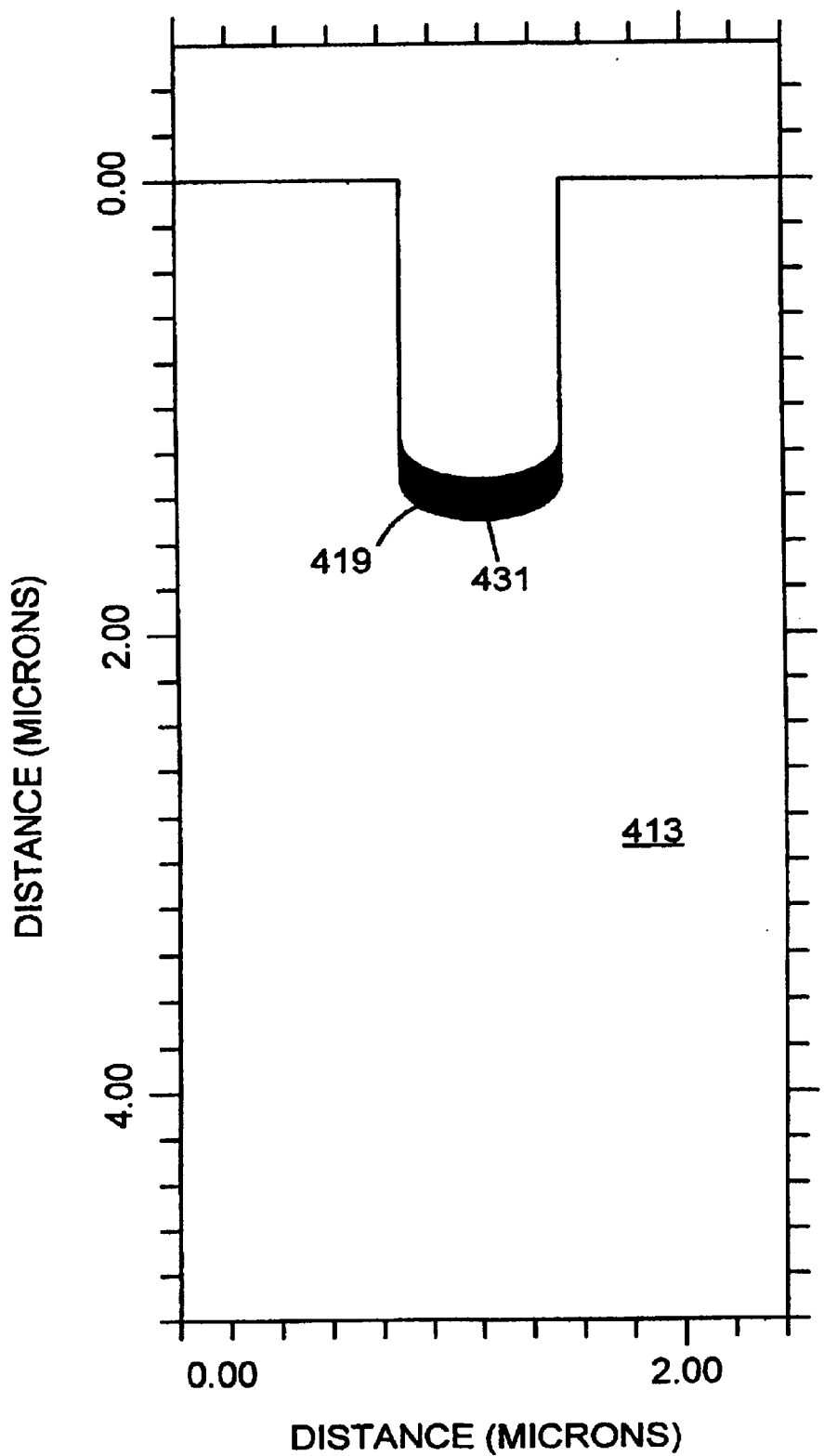

As shown in FIG. 4C, a barrier layer 454 is then deposited by CVD. This deposition can be non-conformal, filling trench 419 and overflowing past the topmost surface of thick insulative layer 431. Barrier layer 454 may be, for example, silicon nitride (Si₃N₄), and may be 2–4 μm thick. Barrier layer 454 is etched back, typically by performing a dry etch followed by a wet etch, using etchants that have high selectivity for barrier layer 454 over thick insulative layer 431. Barrier layer 454 is etched back into trench 419 until only about 0.1–0.2 μm remains in trench 419, as shown in FIG. 4D.

Thick insulative layer 431 is then etched, typically by a wet etch technique, using an etchant that has high selectivity for insulative layer 431 over barrier layer 454 and over N-epi layer 413. Insulative layer 431 is etched from the top of N-epi layer 413 and from the sidewall of trench 419 until insulative layer 431 remains only in the bottom of trench 431. The remainder of barrier layer 454 is removed, leaving the structure shown in FIG. 4E.

Figure 4F:
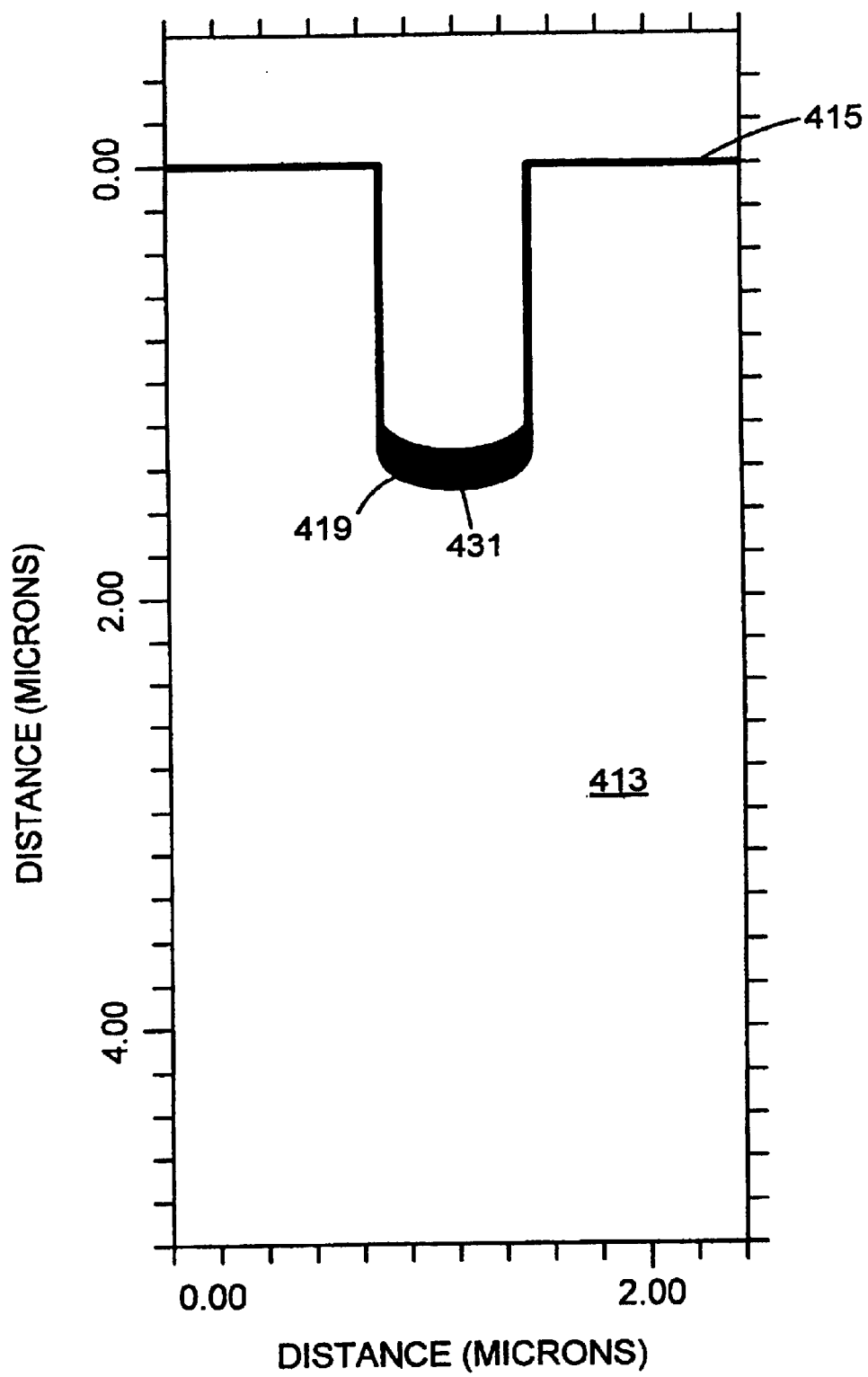

As shown in FIG. 4F, a thin gate insulator 415 (e.g., about 100–1000 Å thick) is then formed on the top surface of N-epi layer 413 and on the sidewall of trench 419. Thin gate insulator 415 may be, for example, a silicon dioxide layer that is thermally grown using a dry oxidation technique at 1050° C. for 20 minutes. In some embodiments, a sacrificial gate oxide (not shown) can be thermally grown and removed by a wet etch to clean the sidewall of trench 419 prior to growing thin gate insulator 415. The wet etch of such a sacrificial gate oxide is kept short to minimize etching of thick insulative layer 431.

Figure 4G:
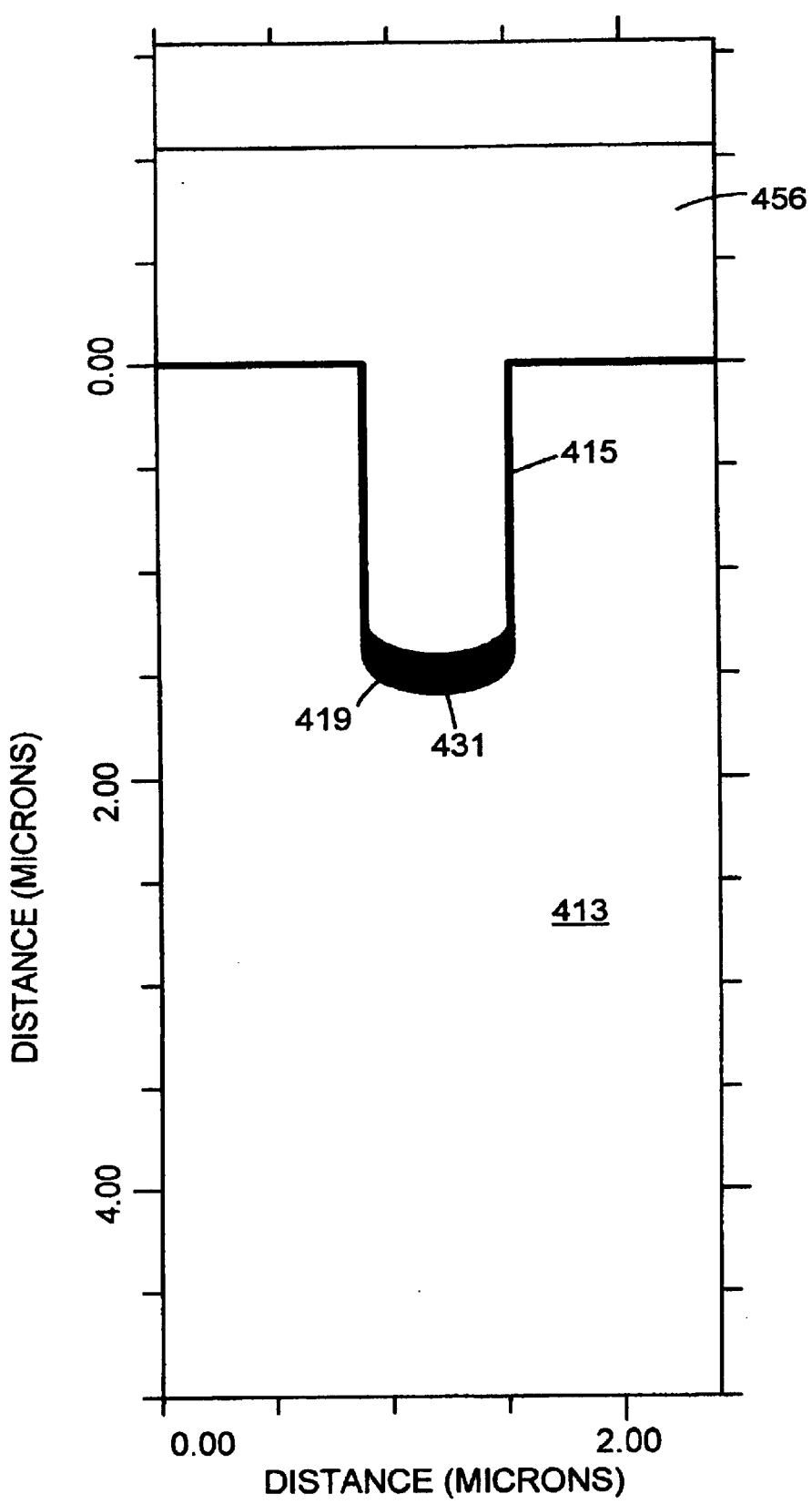
Figure 4H:
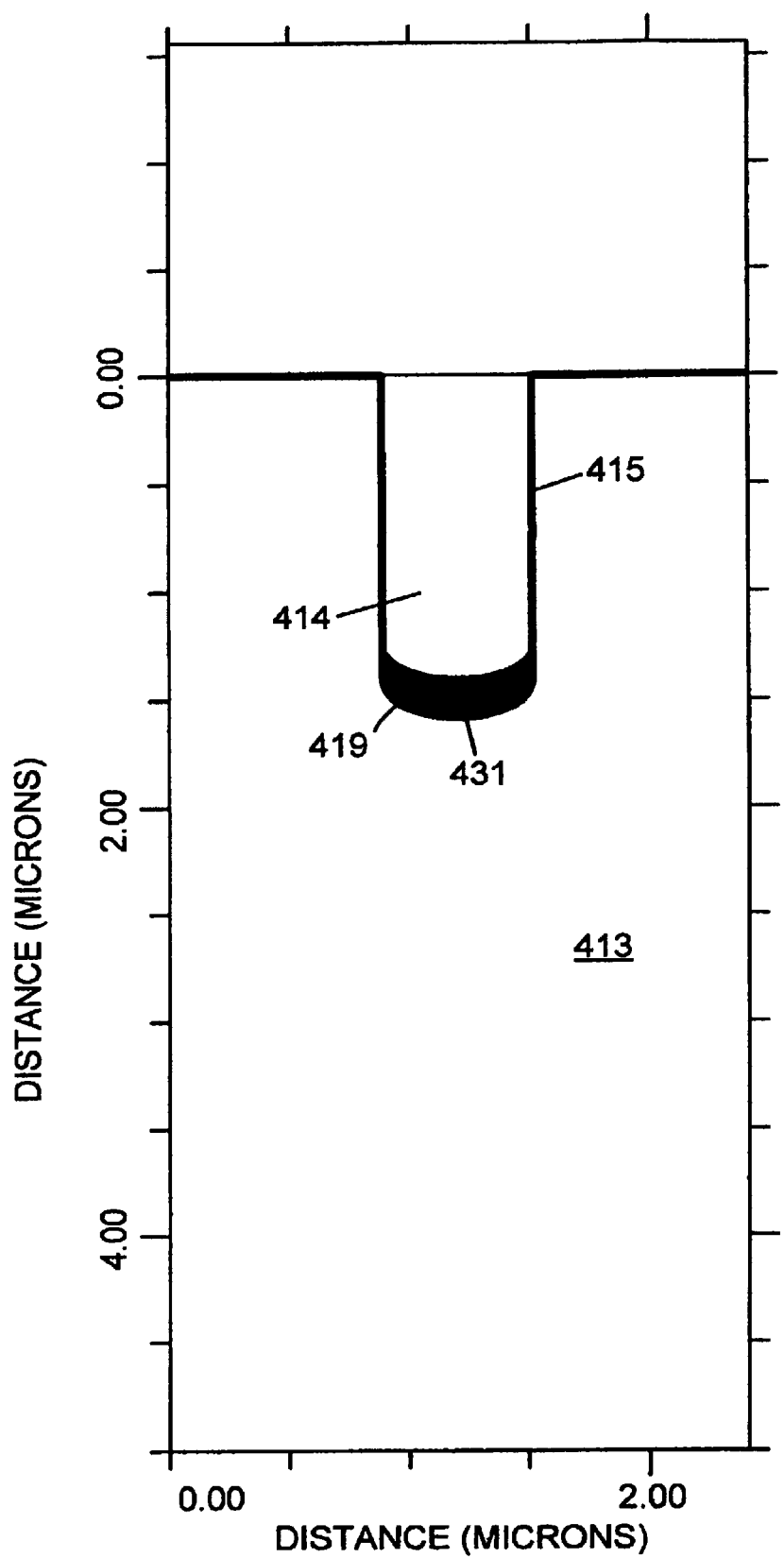

As shown in FIG. 4G, a conductive material 456 is deposited by CVD, possibly by low pressure CVD (LPCVD), to fill trench 419 and overflow past the topmost surface of thin gate insulator 415. Conductive material 456 may be, for example, an in-situ doped polysilicon, or an undoped polysilicon layer that is subsequently implanted and annealed, or an alternative conductive material. Conductive material 456 is etched, typically using a reactive ion etch, until the top surface of material 456 is approximately level with the top of N-epi layer 413, thereby forming gate 414, as shown in FIG. 4H. In an n-type MOSFET, gate 414 may be, for example, a polysilicon layer with a doping concentration of $10^{20}$ cm⁻³. In some embodiments, conductive material 456 may be etched past the top of trench 419, thereby recessing gate 414 to minimize the gate-to-source overlap capacitance.

Figure 4I:
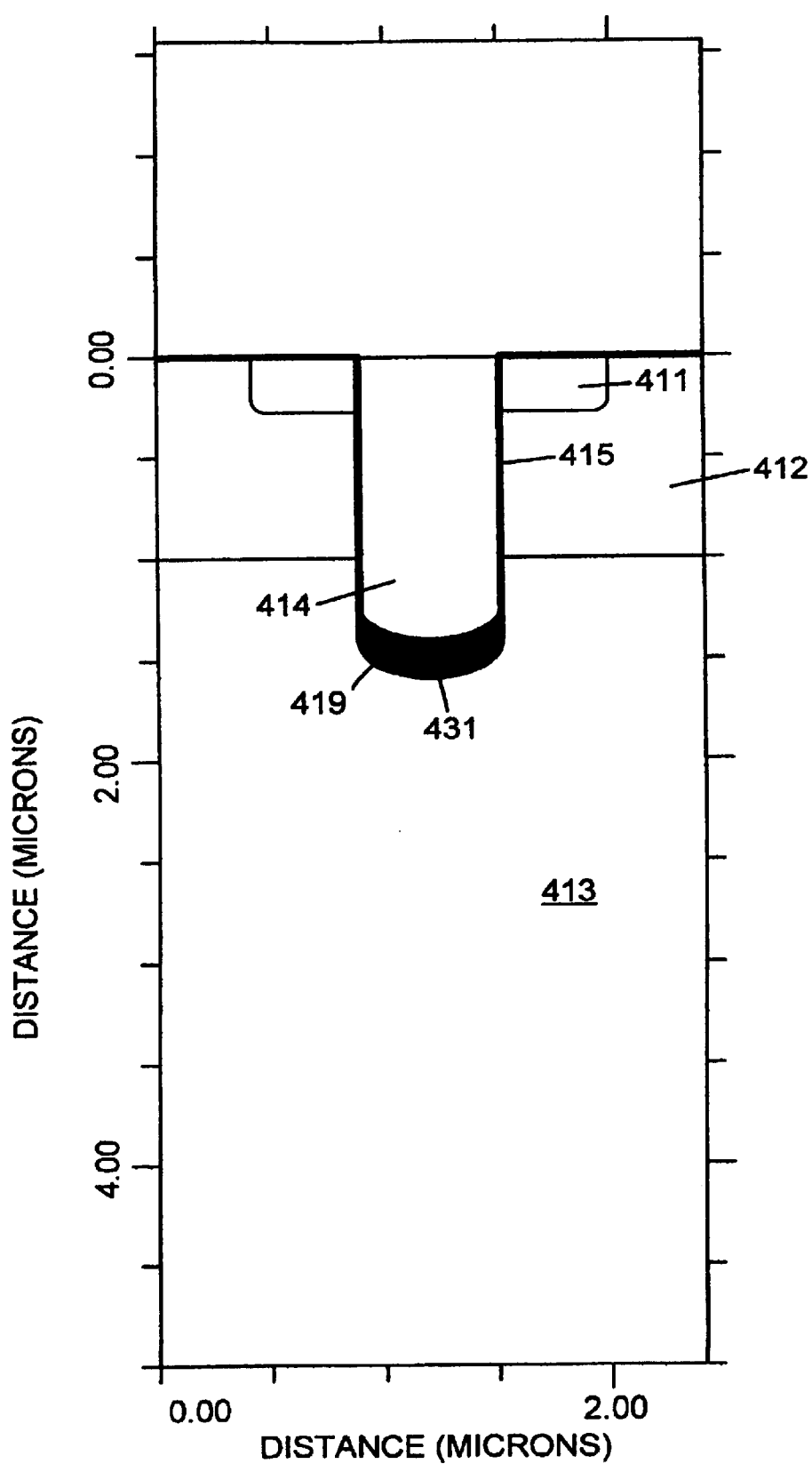

Using known implantation and diffusion processes, p-type body regions 412 and N⁺ source regions 411 are formed in N-epi layer 413 as shown in FIG. 4I. The PN junctions between p-type body regions 412 and the remainder of N-epi layer 413 are located at a depth above the interface between thick insulative layer 431 and thin gate insulator 415.

Figure 4J:
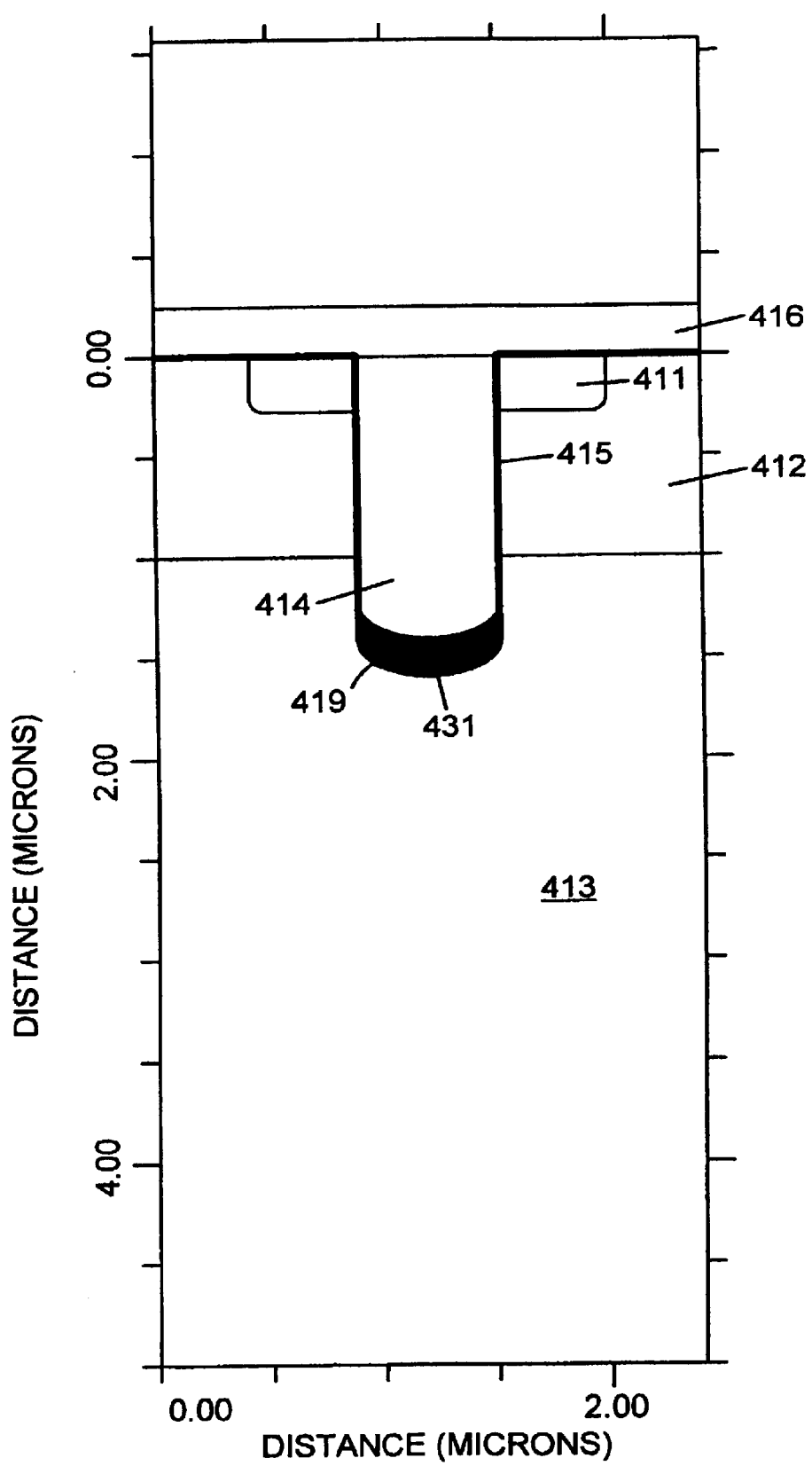
Figure 4K:
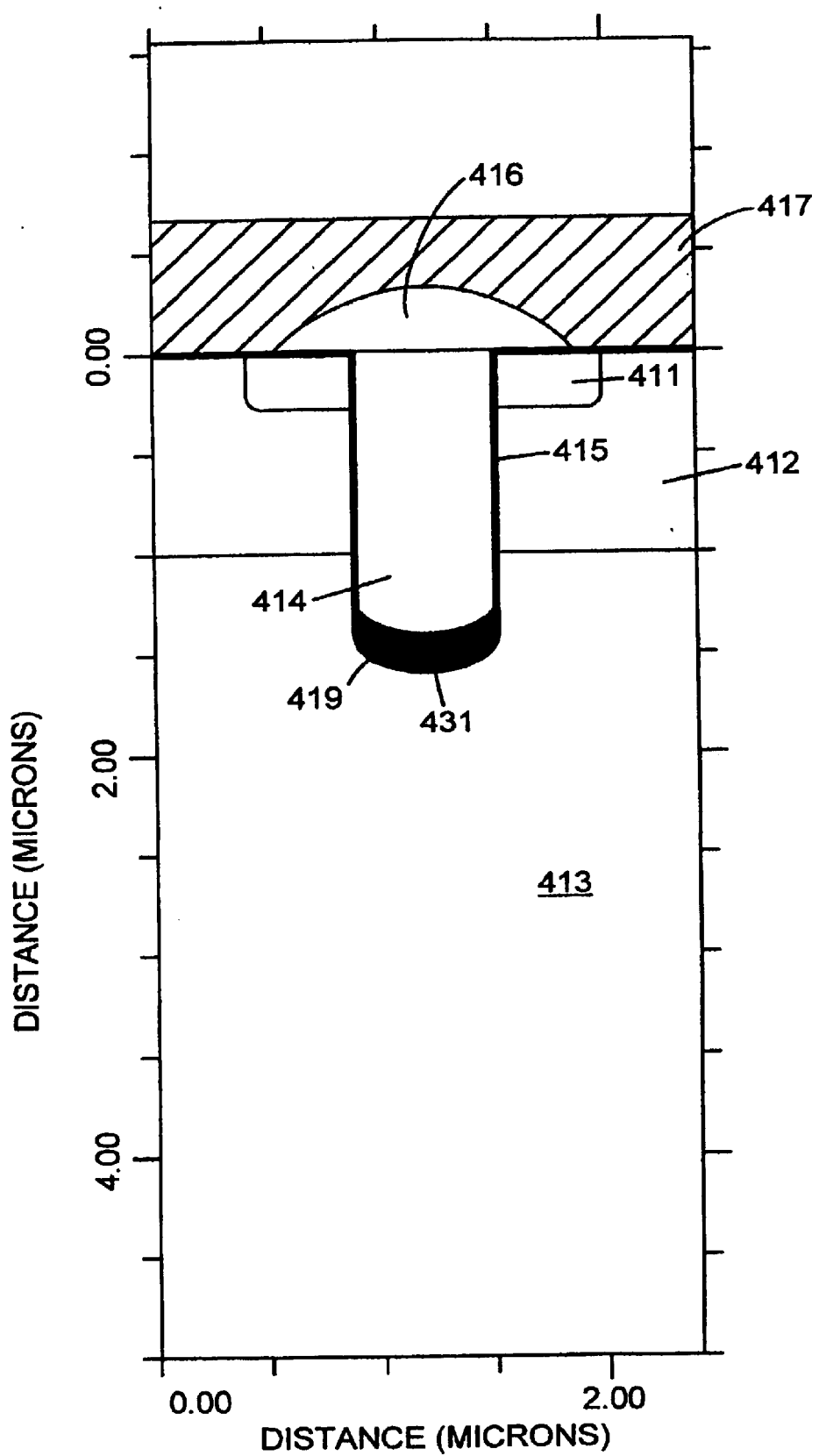

As shown in FIG. 4J, an insulative layer 416, which may be borophosphosilicate glass (BPSG), is deposited by CVD on the surfaces of N-epi layer 413 and gate 414. Insulative layer 416 is etched, typically using a dry etch, to expose portions of p-type body regions 412 and N⁺ source regions 411, as shown in FIG. 4K. Electrical contact to body regions 412 and source regions 411 is made with a conductor 417, which is typically a deposited (e.g., by physical vapor deposition, plating, sputtering, or evaporation) metal or metal alloy. Electrical contact to gate 414 is made in the third dimension, outside of the plane of FIG. 4K. Electrical contact to the drain (not shown) is made to the opposite surface of the N⁺ substrate (not shown) on which N-epi layer 413 is grown.

This method thus allows incorporation of thick insulative layer 431 at the bottom of trench 419 to minimize $C_{gd}$ with minimal undesirable effects or manufacturing concerns, which may be caused by thermally growing thick insulative layer 431. For example, stress effects from growing a thick oxide in the concave bottom of trench 419 are avoided by depositing the oxide rather than thermally growing it. Thinning of the insulative layers at the juncture of thick insulative layer 431 and thin gate insulator 415, possibly caused by formation of a "bird's beak" during a thermal growth of thick insulative layer 431, are avoided by depositing thick insulative layer 431. In addition, shifts in the etched sidewall profile of trench 419 are also avoided by depositing thick insulative layer 431. Growing thick insulative layer 431 could cause such shifts, resulting in a "bulb" effect at the bottom of trench 419 that is not compensated by subsequent growth of thin gate insulator 415 on the sidewall of trench 419.

Figure 5:
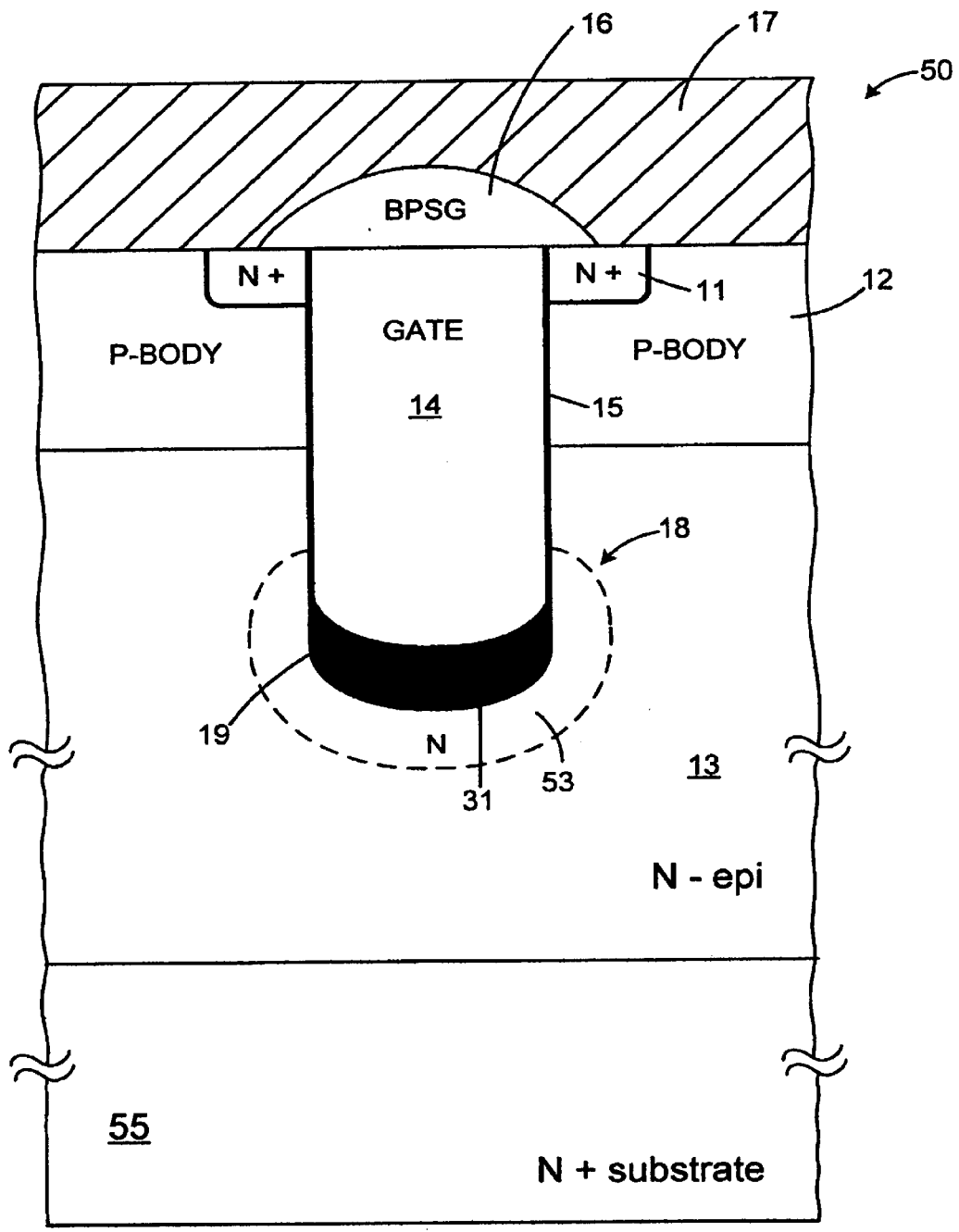
FIG. 5 is a cross-sectional view of an alternative embodiment of a trench MOSFET in accordance with the present invention.

FIG. 5 is a cross-sectional view of an alternative embodiment of a trench MOSFET 50 in accordance with the present invention. MOSFET 50 has many similarities to MOSFET 30 of FIG. 3. In particular, only the sidewall of trench 19 is lined with thin gate insulator 15, while thick insulative layer 31 lines the bottom of trench 19. In MOSFET 30 of FIG. 3, thick insulative layer 31 may increase the on-resistance ($R_{on}$) of MOSFET 30 due to an increase in the spreading resistance in the accumulation layer at the bottom of trench 19. MOSFET 50 of FIG. 5, however, includes a high doping region 53 at the bottom of trench 19 to help spread current more effectively. High doping region 53 is formed in N-epi layer 13, which overlies an $N^+$ substrate 55. High doping region 53 may be created by implanting an n-type dopant, such as arsenic or phosphorous, before mask 450 is removed after the trench etch shown in FIG. 4A. Thus, thick insulative layer 31 minimizes gate-to-drain capacitance, $C_{gd}$, and high doped region 53 minimizes on-resistance, $R_{on}$, yielding a trench MOSFET 50 well-suited for high frequency applications.

The foregoing embodiments are intended to be illustrative and not limiting of the broad principles of this invention. Many additional embodiments will be apparent to persons skilled in the art. For example, the structures and methods of this invention can be used with any type of metal-insulator-semiconductor (MIS) device in which it is desirable to form an insulating layer between a trench gate and a region outside the trench. Also, various insulative or conductive materials can be used where appropriate, and the invention is also applicable to p-type MOSFETs. The invention is limited only by the following claims.

We claim:

1. A method of fabricating an MIS device, comprising:
   providing a semiconductor substrate;
   forming a trench in said substrate, said trench including a sidewall and a bottom;
   depositing a thick insulative layer on said sidewall and said bottom, wherein said thick insulative layer is not formed by thermally oxidizing said semiconductor substrate in said trench;
   depositing a mask layer in said trench;
   etching a first portion of said mask layer to expose a first portion of said thick insulative layer on said sidewall, while leaving a second portion of said mask layer at said bottom of said trench;
   etching said first portion of said thick insulative layer to form an exposed portion of said sidewall, while leaving a second portion of said thick insulative layer at said bottom of said trench;
   etching said second portion of said mask layer to expose said second portion of said thick insulative layer at said bottom of said trench;
   forming a first thin insulative layer on said exposed portion of said sidewall; and
   forming a gate above said portion of said thick insulative layer and adjacent said first thin insulative layer in said trench.

2. The method of claim 1, wherein said forming said first thin insulative layer includes thermally oxidizing said sidewall.

3. The method of claim 2, further comprising:
   growing a thin sacrificial oxide layer on said sidewall prior to said forming said first thin insulative layer and after etching said first portion of said thick insulative layer; and
   removing said sacrificial oxide layer prior to said forming said first thin insulative layer.

4. The method of claim 1, wherein said forming a gate comprises:
   depositing doped polysilicon in said trench; and
   etching said doped polysilicon to a level about equal to said surface of said substrate.

5. The method of claim 1, further comprising growing a second thin insulative layer on said sidewall and said bottom prior to said depositing said thick insulative layer.

6. The method of claim 1, further comprising:
   forming a body region in said substrate adjacent said sidewall; and
   forming a source region in said body region, said source region adjacent said sidewall and a top surface of said substrate.

7. The method of claim 1, further comprising forming a high conductivity region in said substrate adjacent to at least said bottom of said trench.

* * * * *